(12) United States Patent  
Ozeki et al.

(10) Patent No.: US 7,948,059 B2
(45) Date of Patent: May 24, 2011

(54) DIVIDABLE SEMICONDUCTOR DEVICE HAVING CERAMIC SUBSTRATE AND SURFACE MOUNT COMPONENTS COLLECTIVELY SEALED ON PRINCIPLE SURFACE OF CERAMIC SUBSTRATE

(75) Inventors: Yoshio Ozeki, Yokohama (JP); Toshiaki Takai, Yokohama (JP); Makoto Ohta, Tottori (JP); Takahiro Umeyama, Tottori (JP)

(73) Assignee: Hitachi Metals, Ltd., Tokyo (JP)

( * ) Notice: Subject to any disclaimer, the term of this patent is extended or adjusted under 35 U.S.C. 154(b) by 235 days.

(21) Appl. No.: 11/647,128

(22) Filed: Dec. 29, 2006

(65) Prior Publication Data

US 2007/0273022 A1  Nov. 29, 2007

(30) Foreign Application Priority Data

Mar. 17, 2006  (JP) .................................. 2006-074041

(51) Int. Cl.
*H01L 23/544* (2006.01)

(52) U.S. Cl. . 257/620; 257/622; 257/787; 257/E21.524; 438/110

(58) Field of Classification Search .................. 257/620, 257/622, 700, 787, 788; 438/106, 110, 111, 438/112, 113, 114, 462
See application file for complete search history.

(56) References Cited

U.S. PATENT DOCUMENTS

| | | | |
|---|---|---|---|
| 6,638,592 B1 | 10/2003 | Schulz-Harder | |
| 6,831,360 B2 | 12/2004 | Yamaura et al. | |
| 6,979,593 B2 * | 12/2005 | Kawakami | 438/113 |
| 7,223,636 B2 | 5/2007 | Kobayashi et al. | |
| 2001/0037892 A1 * | 11/2001 | Corisis | 174/52.1 |
| 2002/0056892 A1 | 5/2002 | Corisis | |
| 2005/0042805 A1 * | 2/2005 | Swenson et al. | 438/113 |
| 2007/0105283 A1 | 5/2007 | Kobayashi et al. | |

FOREIGN PATENT DOCUMENTS

| | | |
|---|---|---|
| EP | 1 061 783 A2 | 12/2000 |
| JP | 11-031704 | 2/1999 |
| JP | 11-317383 A | 11/1999 |
| JP | 2002-208668 | 7/2002 |
| JP | 2003-110083 | 4/2003 |
| JP | 2005-135977 A | 5/2005 |
| JP | 2005-217133 A | 8/2005 |
| JP | 2006-13318 A | 1/2006 |

* cited by examiner

*Primary Examiner* — Marcos D. Pizarro
*Assistant Examiner* — Eva Yan Montalvo
(74) *Attorney, Agent, or Firm* — Antonelli, Terry, Stout & Kraus, LLP.

(57) ABSTRACT

In a semiconductor device comprising a ceramic substrate, a surface mount component, and sealing resin and obtained by division into pieces, the ceramic substrate is composed of a multiple piece substrate provided with dividing grooves for the division into pieces on both front and rear surfaces in advance, a plurality of the surface mount components are mounted on the multiple piece substrate and sealed collectively by the sealing resin, and the substrate is divided along the dividing grooves. Further, when the shortest distance from an end on the front surface of the ceramic substrate to an end of the surface mount component is set to "a" μm, a thickness of the ceramic substrate is set to "b" μm, and sum of depths of the dividing grooves on the front and rear surfaces of the ceramic substrate is set to "c" μm, a relationship of $a \geq 269 \times c/b + 151$ is established.

6 Claims, 8 Drawing Sheets

$c = c_1 + c_2$

DIVIDABLE SEMICONDUCTOR DEVICE HAVING CERAMIC SUBSTRATE AND SURFACE MOUNT COMPONENTS COLLECTIVELY SEALED ON PRINCIPLE SURFACE OF CERAMIC SUBSTRATE

CROSS-REFERENCE TO RELATED APPLICATION

The present application claims priority from Japanese Patent Application No. JP 2006-074041 filed on Mar. 17, 2006, the content of which is hereby incorporated by reference into this application.

TECHNICAL FIELD OF THE INVENTION

The present invention relates to a semiconductor device manufacturing technology. More particularly, it relates to a manufacturing process of semiconductor devices in which a plurality of surface mount components are sealed collectively by resin and then divided into individual modules, and it can be effectively applied to, for example, a mobile device incorporated with the semiconductor device.

BACKGROUND OF THE INVENTION

For example, in the manufacturing process of semiconductor devices to be incorporated in a mobile device, surface mount components are electrically connected on a ceramic substrate, and after the surface mount components are collectively sealed by sealing resin for the purpose of protection of the surface mount components, the height reduction, weight reduction and downsizing of modules, the substrate is divided into individual modules. The surface mount components are connected using a connecting material such as solder through the mounting of components such as a capacitor, a resistor, and a filter (passive components here), the face-up mounting, flip chip mounting, and ball grid array (BGA) mounting including a chip size package (CSP) of semiconductor elements.

In this process, as a method of dividing into individual modules, a method in which the division can be stably performed while preventing the exposure of the surface mount components, electric wires, and electrodes due to the dividing grooves formed on a ceramic substrate in advance, dividing grooves on a sealing resin formed by a dicing machine or a laser cutting machine, and mechanical load on the dividing grooves has been used in recent years.

On the other hand, since an expensive apparatus for forming the dividing grooves on the sealing resin is additionally required in this dividing method, a simpler dividing technology has become necessary from the viewpoint of cost reduction. Therefore, a technology in which the division can be stably performed with high positional accuracy while preventing the exposure of the surface mount components mounted around the dividing grooves due to the shape of the dividing grooves formed on the ceramic substrate and the mechanical load, without additionally providing the expensive apparatus for forming the dividing grooves on the sealing resin, has been required.

For example, according to the description of Japanese Patent Application Laid-Open Publication No. 2003-110083 (Patent Document 1), the collective sealing using soft sealing resin such as silicone resin is performed, and only a sealing resin portion is cut along a partition line in advance. By this means, division of a multiple piece substrate after the collective sealing can be easily performed.

Also, according to the description of Japanese Patent Application Laid-Open Publication No. 11-31704 (Patent Document 2), V-shaped dividing grooves formed by a cutter on both sides of a base substrate such as glass epoxy or alumina are provided in advance, depth dimensions of the dividing grooves are set to about ⅓ of the base substrate, the depth of the dividing grooves formed on the sealing resin of the base substrate is designed to be approximately equal to a thickness of the sealing resin, and epoxy resin is used as the sealing resin. By this means, a semiconductor device in which a surface of the sealing resin is flat can be easily manufactured at low cost.

SUMMARY OF THE INVENTION

Incidentally, in the above-described conventional technologies, since a sealing resin portion is cut in advance along a partition line in order to easily divide the multiple piece substrate, a multiple piece substrate can be stably divided without exposing the surface mount components, the electric wires, and the electrodes mounted around the dividing grooves. However, there is a problem that an expensive cutting machine is required and the cost is thus increased.

Further, it is possible to easily manufacture a semiconductor device in which a surface of sealing resin is flat at low cost by providing V-shaped dividing grooves formed by a cutter on both sides of a base substrate such as glass epoxy or alumina in advance, setting depth dimensions of the dividing grooves provided on both sides to about ⅓ of the base substrate, designing the depth of the dividing grooves formed on the sealing resin side of the base substrate to be approximately equal to a thickness of the sealing resin, and using epoxy resin as the sealing resin. Even in this case, however, there is a problem that an extending direction of cracks generated at the time of division is liable to vary and surface mount components mounted around the dividing grooves are exposed. Also, since each depth of the dividing grooves provided on both the sides of the base substrate is set to about ⅓ of the base substrate, there is a problem in workability that the base substrate is broken in a conveying process of the base substrate only.

In view of these circumstances, an object of the present invention is to provide a semiconductor device in which division into respective modules is performed with high positional accuracy while suppressing the variation of an extending direction of cracks produced at the time of division, even when only a dividing groove formed in advance at the time of manufacturing a ceramic substrate is provided and no dividing groove is provided on a sealing resin portion.

The above and other objects and novel characteristics of the present invention will be apparent from the description of this specification and the accompanying drawings.

The typical ones of the inventions disclosed in this application will be briefly described as follows.

For the achievement of the above-described object, the present invention is applied to a semiconductor device comprising: ceramic substrate; a surface mount component mounted on the ceramic substrate; and sealing resin for sealing the surface mount component mounted on the ceramic substrate. In a manufacturing process thereof, the ceramic substrate is composed of a multiple piece substrate in which dividing grooves for division into respective pieces are formed on both front and rear surfaces in advance, a plurality of the surface mount components are mounted on the multiple piece substrate and sealed collectively by the sealing resin, and the substrate is divided along the dividing grooves, thereby manufacturing respective pieces having dimensions defined by the ceramic substrate. Also, when the shortest distance from an end on the front surface of the ceramic substrate to an end of the surface mount component is set to "a" μm, a thickness of the ceramic substrate is set to "b" μm, and sum of depths of the dividing grooves on the front and rear surfaces of the ceramic substrate is set to "c" μm, a relationship of a≧269×c/b+151 is established.

Also, in a manufacturing process thereof, the ceramic substrate is composed of a multiple piece substrate in which dividing grooves for division into respective pieces are formed only on a rear surface in advance, a plurality of the surface mount components are mounted on the multiple piece substrate and sealed collectively by the sealing resin, and the substrate is divided along the dividing grooves, thereby manufacturing respective pieces having dimensions defined by the ceramic substrate. Also, when the shortest distance from an end on the front surface of the ceramic substrate to an end of the surface mount component is set to "a" μm, a thickness of the ceramic substrate is set to "b" μm, and a depth of the dividing groove on the rear surface of the ceramic substrate is set to "c" μm, a relationship of a≧−120×c/b+253 is established.

Also, the present invention provides the semiconductor device according to the preceding paragraph, wherein the semiconductor device has a structure where a relationship of 0<c/b<2/3 is established.

Also, the present invention provides the semiconductor device according to the preceding paragraph, wherein elasticity modulus of sealing resin at the time of division into respective pieces is 0.5 GPa or more.

Also, the present invention provides the semiconductor device according to the preceding paragraph, wherein Vickers hardness Hv of the sealing resin at the time of division into respective pieces is 2.3 or more.

Also, the present invention provides the semiconductor device according to the preceding paragraph, wherein material of the sealing resin primarily contains epoxy resin.

Also, the present invention provides the semiconductor device according to the preceding paragraph, wherein the surface mount components comprise at least one of a capacitor, a resistor, a filter, an inductor, a semiconductor element with a face-up mounting structure, a semiconductor element with a flip chip mounting structure, and a semiconductor element with a ball grid array mounting structure including a chip size package.

The effects obtained by typical aspects of the present invention will be briefly described below.

According to the present invention, even when only dividing grooves formed in advance at the time of manufacturing a ceramic substrate are used and no dividing groove is provided on a sealing resin portion, division can be performed with high positional accuracy, while suppressing the variation of an extending direction of cracks generated at the time of division. Therefore, an expensive apparatus for forming a dividing groove on the sealing resin is not used, and the cost of the semiconductor device can be thus reduced.

BRIEF DESCRIPTIONS OF THE DRAWINGS

Figure 13:
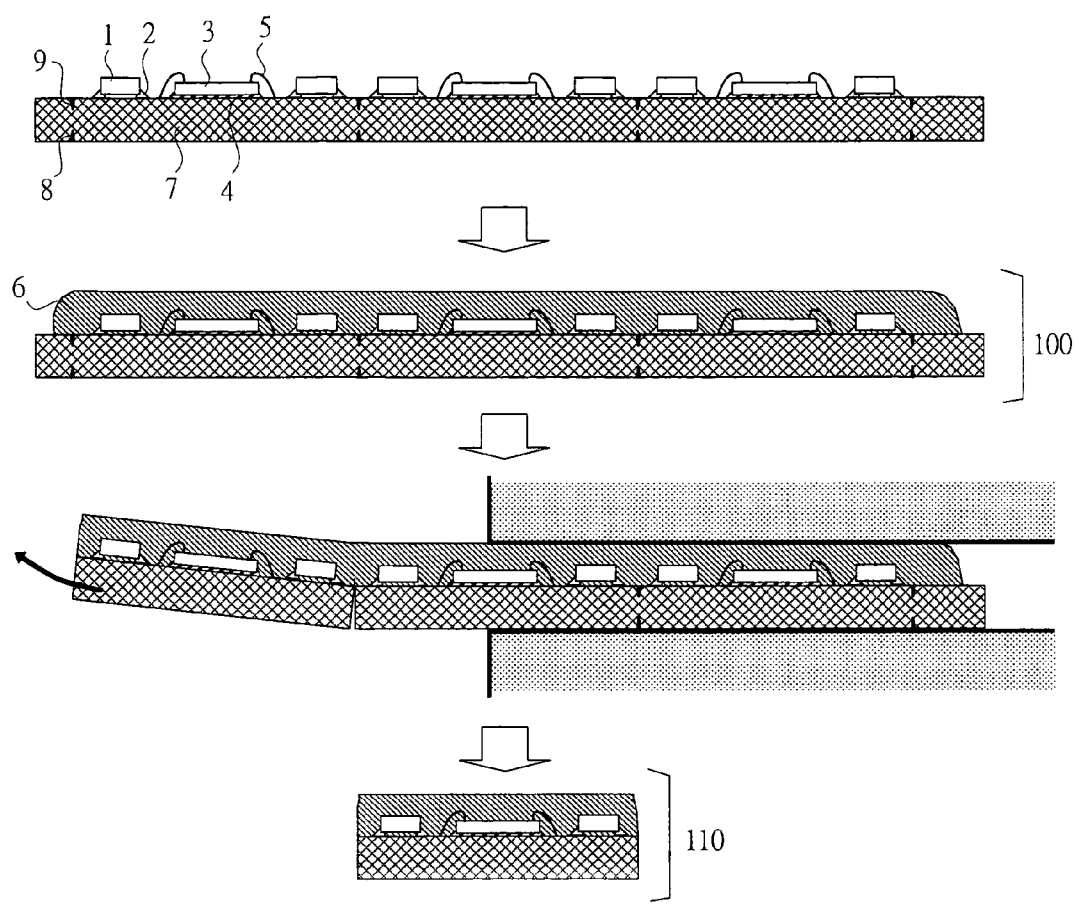
Figure 14:
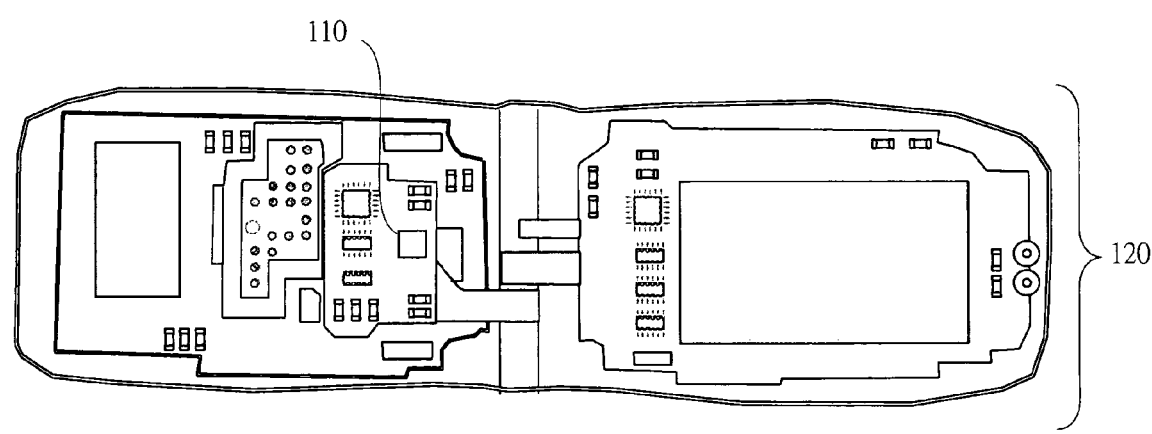

FIG. 13 is a sectional view showing a process from the manufacture of semiconductor devices sealed collectively to the manufacture of each piece of the semiconductor device in a seventh embodiment of the present invention; and FIG. 14 is a schematic diagram showing a state where a semiconductor device obtained by dividing the collectively-sealed semiconductor devices into pieces is mounted on a mobile device in an eighth embodiment of the present invention.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

In the embodiments of the present invention, a semiconductor device is manufactured through the steps of: mounting surface mount components (for example, passive components such as a capacitor, a resistor, a filter, and an inductor and semiconductor elements such as an antenna switch, a receiver, a transmitter, a power amplifier, a filter, and a transceiver) on a ceramic substrate using an electrically-conductive connecting material; providing sealing resin for the purpose of protection of the surface mount components and electric wires on the ceramic substrate; and performing division into individual modules (pieces) after collective sealing by the sealing resin.

As a material of the semiconductor element, GaAs or Si is used in general, and as a material of the sealing resin, thermosetting sealing resin is used in general. Also, as a material of the ceramic substrate, alumina, mullite, aluminum nitride, glass ceramics, ferrite, or compound containing these materials as a main material is used.

Note that the present invention can be applied to not only a semiconductor device including the structure described above but also the semiconductor device in which other substrate and sealing resin are combined.

Hereinafter, each embodiment of the present invention will be described in detail.

First Embodiment

Figure 1:
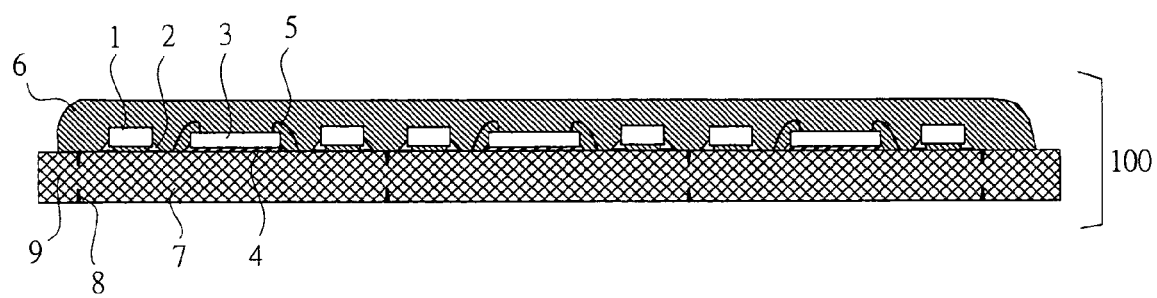
FIG. 1 is a sectional view showing semiconductor devices sealed collectively in a first embodiment of the present invention.
Figure 2:
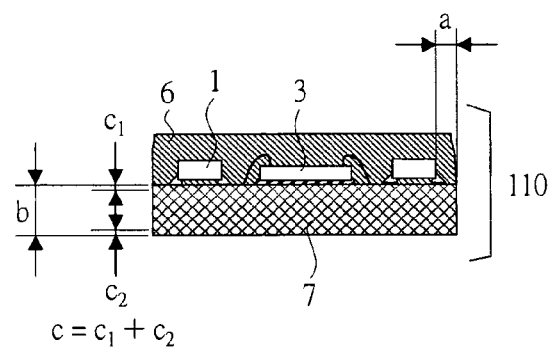
FIG. 2 is a sectional view showing a semiconductor device obtained by dividing the semiconductor devices into pieces in the first embodiment of the present invention.
Figure 3:
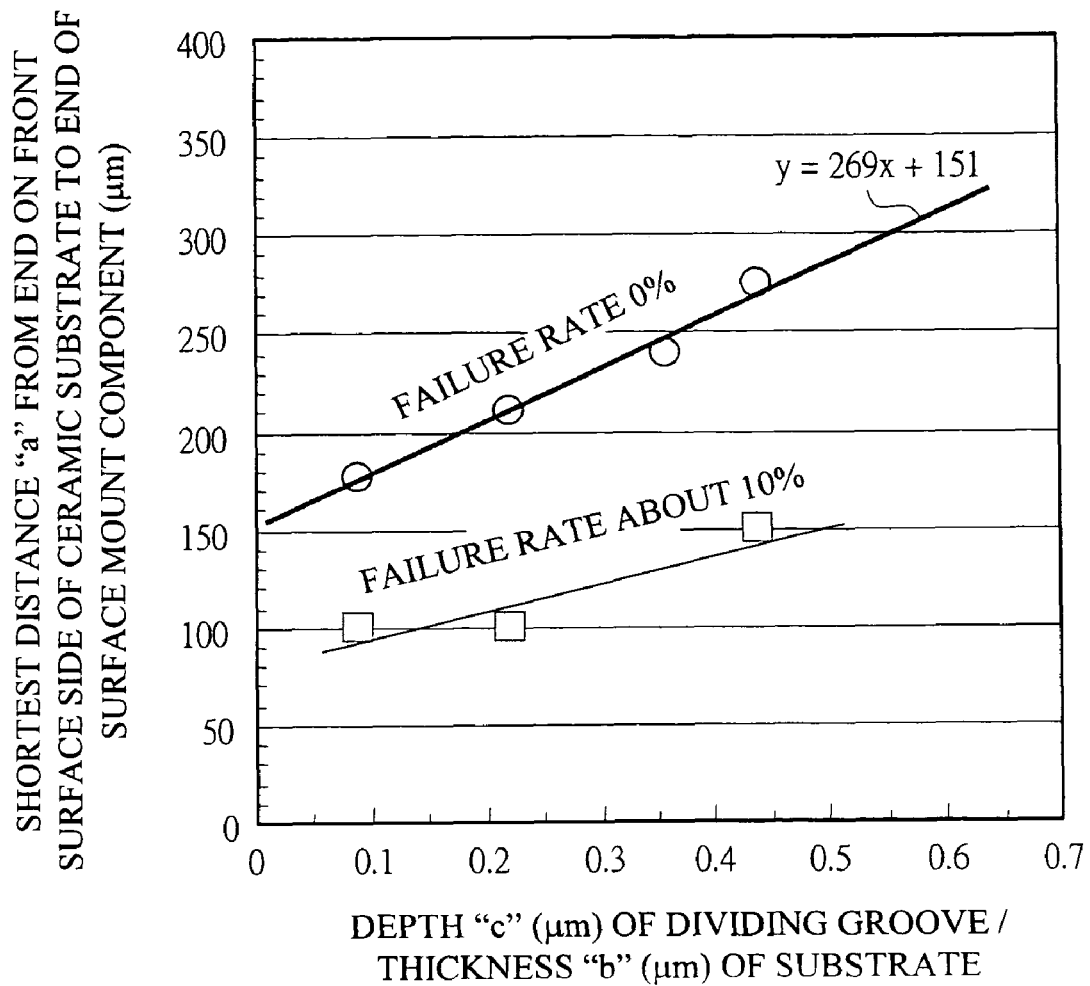
FIG. 3 is a characteristic diagram showing an actual measurement result when dividing grooves are formed on both sides of a substrate in the first embodiment of the present invention.

FIG. 1 to FIG. 3 are diagrams showing a first embodiment of the present invention. FIG. 1 is a sectional view showing semiconductor devices sealed collectively, FIG. 2 is a sectional view showing a semiconductor device obtained by dividing the semiconductor devices into pieces, and FIG. 3 is a characteristic diagram showing an actual measurement result when dividing grooves are formed on both sides of a substrate.

As shown in FIG. 1, semiconductor devices 100 sealed collectively are composed of passive components 1, connecting materials 2, semiconductor elements 3, connecting materials 4, wires 5, sealing resin 6, a ceramic substrate 7, dividing grooves 8 and 9 and others. In this structure, the passive components 1 are connected and fixed to electrodes on the ceramic substrate 7 using the electrically and mechanically connecting materials 2, the semiconductor elements 3 are mechanically fixed on the ceramic substrate 7 using the connecting materials 4, and the wires 5 such as Au are used for the electrical connection between electrodes of the semiconductor elements 3 and the electrodes of the ceramic substrate 7. Further, for the purpose of the protection of the passive components 1, the semiconductor elements 3, the wires 5 and others, they are collectively sealed by the sealing resin 6. In the collectively-sealed semiconductor devices 100, the ceramic substrate 7 has the dimensions of a multiple piece substrate.

In the structure of the semiconductor devices 100 in which the passive components 1 and the semiconductor elements 3 are mounted on the ceramic substrate 7 and are sealed collectively by the sealing resin 6, FIG. 1 shows a structure in the case where the dividing grooves 8 and 9 for dividing the collectively-sealed semiconductor devices 100 into respective pieces are provided on both a front surface and a rear surface of the ceramic substrate 7 to be sealed by the sealing resin 6 in a manufacturing process of the ceramic substrate 7 in advance. Here, it is required to form the semiconductor devices 100 so as to be stably divided with high positional accuracy, without exposing the surface mount components (for example, the passive components 1 in FIG. 1) mounted around the dividing grooves 9, even if no dividing groove is provided using an expensive apparatus on a front surface of the sealing resin 6 after the collective sealing.

Then, for dividing the collectively-sealed semiconductor devices 100 into pieces to stably obtain such a semiconductor device 110 as shown in FIG. 2 with high positional accuracy, the division is actually measured, and an actual measurement result thereof is shown in FIG. 3. FIG. 3 shows a relationship between the shortest distance (vertical axis) from an end on the front surface of the ceramic substrate 7 to an end of the passive component 1 when the semiconductor devices are divided into pieces and a value obtained by dividing the sum of depths of the dividing grooves 8 and 9 on the front and rear surfaces of the ceramic substrate 7 by a thickness of the ceramic substrate 7 (horizontal axis). More specifically, it can be understood that, when the shortest distance from the end on the front surface of the ceramic substrate 7 to the end of the passive component 1 when the semiconductor devices are divided into pieces is set to "a" μm, the thickness of the ceramic substrate 7 is set to "b" μm, and the sum of the depths of the dividing grooves 8 and 9 on the front and rear surfaces of the ceramic substrate 7 is set to "c(=c1+c2)" μm, a failure rate becomes 0% under the condition of y=269x+151 (y=a, x=c/b). Therefore, by disposing the passive component 1 at a position where a≧269×c/b+151 is satisfied, the semiconductor devices can be stably divided with high positional accuracy.

Further, by setting the depths of the dividing grooves 8 and 9 of the ceramic substrate 7 to 0<c/b<2/3, the ceramic substrate 7 can be handled stably without breaking the ceramic substrate 7 before the collective sealing.

Here, the shortest distance "a" shown in FIG. 2 is defined as the shortest distance from the end on the front surface side of the ceramic substrate 7 to the end of the passive component 1 when the semiconductor devices are divided into pieces. However, the shortest distance "a" can be similarly applied to the case where the semiconductor element 3 is positioned at the end of the ceramic substrate 7. More specifically, it is desired that the shortest distance "a" is the shortest distance among the shortest distances from the end on the front surface of the ceramic substrate 7 to the end of the passive component 1 when the semiconductor devices are divided into pieces, from the end on the front surface of the ceramic substrate 7 to an end surface of the semiconductor element 3 when the semiconductor devices are divided into pieces, and from the end on the front surface of the ceramic substrate 7 to a connecting end of the wire 5 which electrically connects the electrode of the semiconductor element 3 and the electrode of the ceramic substrate 7 when the semiconductor devices are divided into pieces. Further, it is desired that a thickness of the sealing resin 6 is equal to or less than the thickness of the ceramic substrate 7 from the viewpoint of dividing properties.

It is desired that the connecting material 2 for electrically and mechanically connecting and fixing the passive component 1 is solder or electrically-conductive adhesive obtained by mixing conductive particles such as Ag and insulating adhesive primarily containing epoxy, acrylic, polyester or the like. Also, it is desired that the connecting material 4 for mechanically fixing the semiconductor element 3 is solder, electrically-conductive adhesive, insulating adhesive, or the like.

As described above, according to this embodiment, even when only the dividing grooves 8 and 9 formed in advance at the time of manufacturing the ceramic substrate 7 are provided and no dividing groove is provided on the sealing resin portion, the semiconductor devices 100 can be divided with high positional accuracy, while suppressing the variations of an extending direction of cracks at the time of division. Therefore, since it is unnecessary to additionally use an expensive apparatus for forming a dividing groove on the sealing resin, costs of the semiconductor devices 110 divided into pieces can be reduced.

Second Embodiment

Figure 4:
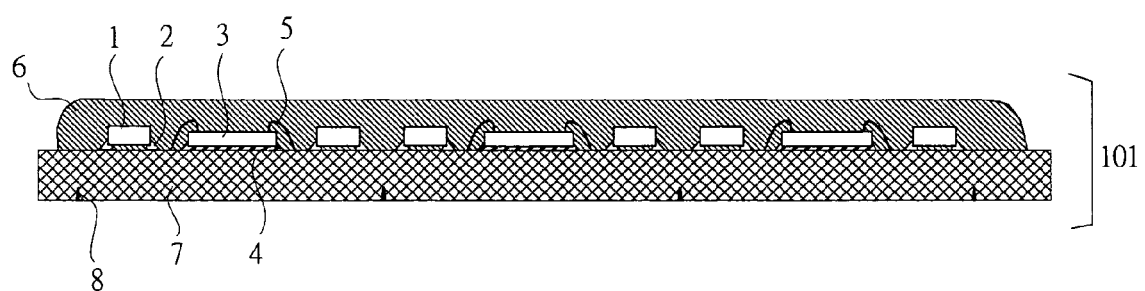
FIG. 4 is a sectional view showing semiconductor devices sealed collectively in a second embodiment of the present invention.
Figure 5:
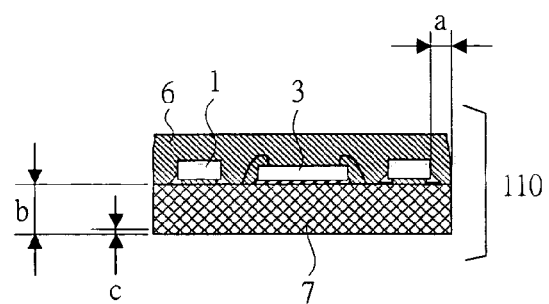
FIG. 5 is a sectional view showing a semiconductor device obtained by dividing the semiconductor devices into pieces in the second embodiment of the present invention.
Figure 6:
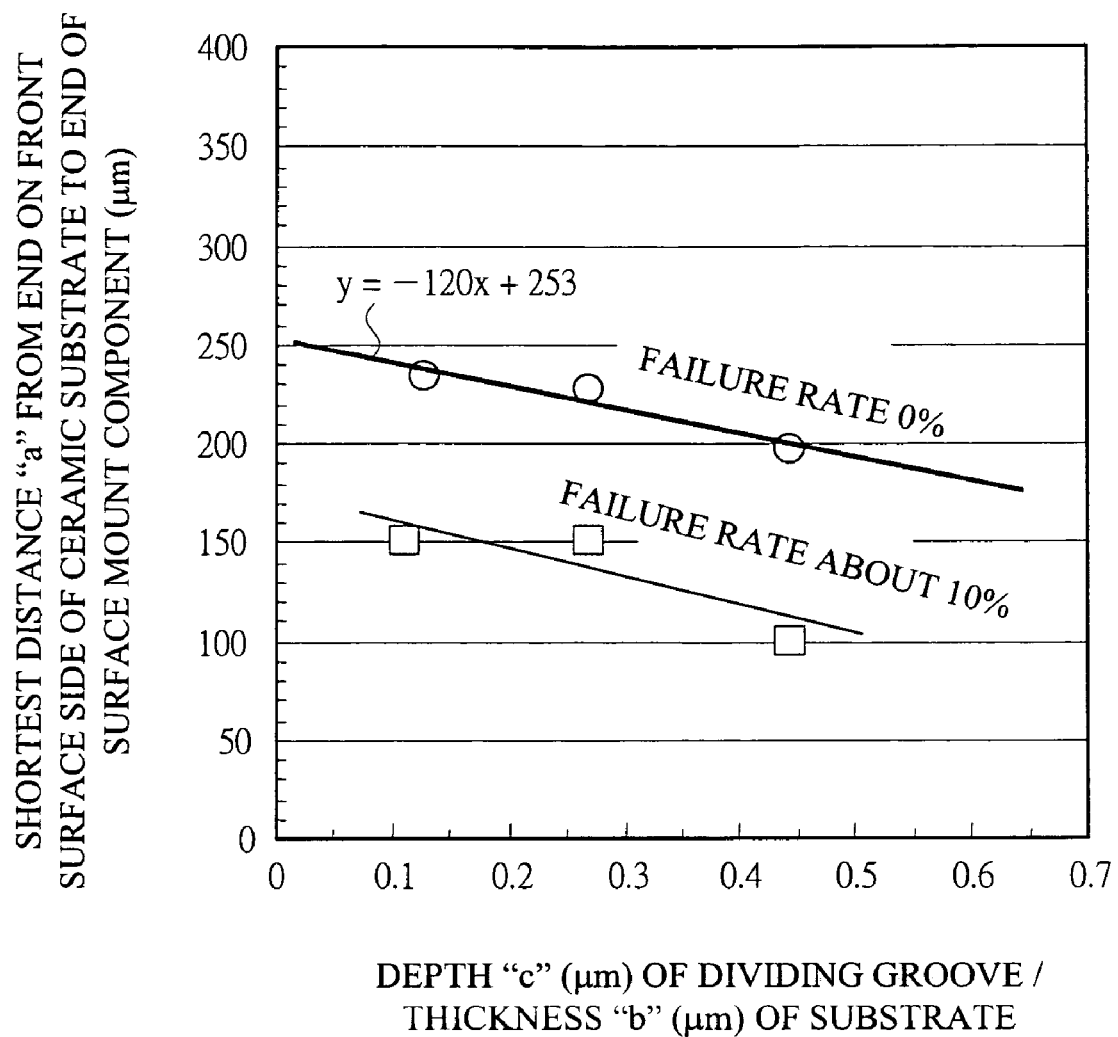
FIG. 6 is a characteristic diagram showing an actual measurement result when dividing grooves are formed on one side of a substrate in the second embodiment of the present invention.

FIG. 4 to FIG. 6 are diagrams showing a second embodiment of the present invention. FIG. 4 is a sectional view showing the semiconductor devices sealed collectively, FIG. 5 is a sectional view showing a semiconductor device obtained by dividing the semiconductor devices into pieces, and FIG. 6 is a characteristic diagram showing an actual measurement result when dividing grooves are formed on one side of a substrate.

The embodiment is different from the first embodiment in the formation of dividing grooves. As shown in FIG. 4, semiconductor devices 101 sealed collectively are composed of the passive components 1, the connecting materials 2, the semiconductor elements 3, the connecting materials 4, the wires 5, the sealing resin 6, the ceramic substrate 7, the dividing grooves 8 and the like. In this structure, the dividing grooves 8 for dividing the collectively-sealed semiconductor devices 101 into respective pieces are provided only on the rear surface of the ceramic substrate 7 in the step of forming the ceramic substrate 7 in advance. Also in this case, it is required to form the semiconductor devices 101 so as to be stably divided with high positional accuracy, without exposing the surface mount components (for example, the passive components 1 in FIG. 4) mounted around the dividing grooves 9, even if no dividing groove is provided using an expensive apparatus on a surface of the sealing resin 6 after the collective sealing.

Then, for dividing the collectively-sealed semiconductor devices 101 into pieces to stably obtain such a semiconductor device 110 as shown in FIG. 5 with high positional accuracy, the division is actually measured, and an actual measurement result thereof is shown in FIG. 6. FIG. 6 shows a relationship between the shortest distance (vertical axis) from an end on the front surface of the ceramic substrate 7 to an end of the passive component 1 when the semiconductor devices are divided into pieces and a value obtained by dividing the depth of the dividing groove 8 on the rear surface of the ceramic substrate 7 by a thickness of the ceramic substrate 7 (horizontal axis). More specifically, it can be understood that, when the shortest distance from the end on the front surface of the ceramic substrate 7 to the end of the passive component 1 when the semiconductor devices are divided into pieces is set to "a" µm, the thickness of the ceramic substrate 7 is set to "b" µm, and the depth of the dividing groove 8 on the rear surface of the ceramic substrate 7 is set to c µm, a failure rate becomes 0% under the condition of $y=-120x+253$ ($y=a$, $x=c/b$). Therefore, by disposing the passive component 1 at a position where $a \geq 0120 \times c/b + 253$ is satisfied, the semiconductor devices can be stably divided with high positional accuracy.

Further, by setting the depth of the dividing groove 8 of the ceramic substrate 7 to $0 < c/b < 2/3$, the ceramic substrate 7 can be handled stably without breaking the ceramic substrate 7 before the collective sealing.

Similar to the first embodiment, it is desired that the shortest distance "a" is the shortest distance among the shortest distances from the end on the front surface of the ceramic substrate 7 to the end of the passive component 1 when the semiconductor devices are divided into pieces, from the end on the front surface of the ceramic substrate 7 to an end surface of the semiconductor element 3 when the semiconductor devices are divided into pieces, and from the end on the front surface of the ceramic substrate 7 to a connecting end of the wire 5 which electrically connects the electrode of the semiconductor element 3 and the electrode of the ceramic substrate 7 when the semiconductor devices are divided into pieces. Further, it is desired that a thickness of the sealing resin 6 is equal to or less than the thickness of the ceramic substrate 7 from the viewpoint of dividing properties.

As described above, according to this embodiment, similar to the first embodiment, even when the dividing grooves 8 are formed only on the rear surface of the ceramic substrate 7, the semiconductor devices 101 can be divided with high positional accuracy, while suppressing the variations of an extending direction of cracks at the time of division. Therefore, since it is unnecessary to additionally use an expensive apparatus for forming a dividing groove on the sealing resin, costs of the semiconductor devices 110 divided into pieces can be reduced.

Third Embodiment

Figure 7:
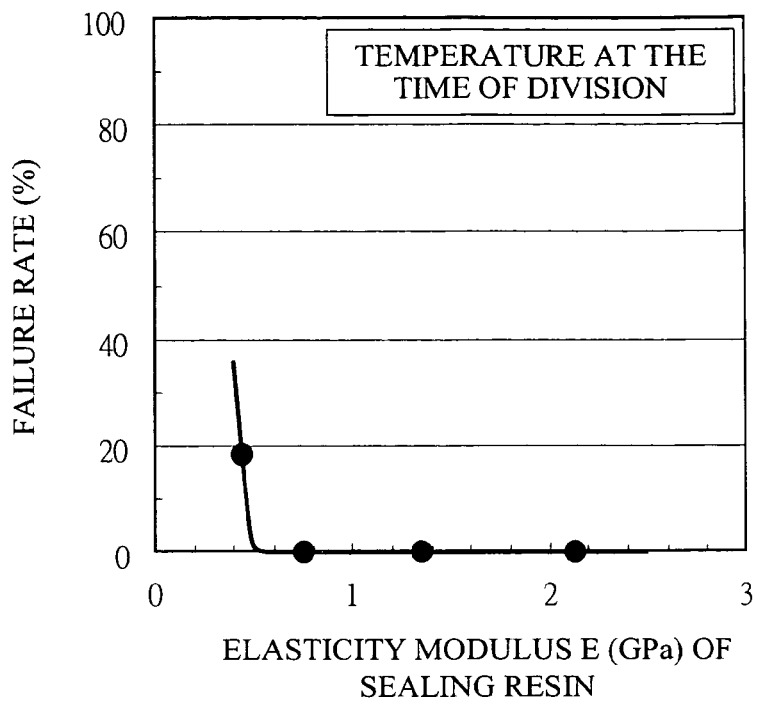
FIG. 7 is a characteristic diagram showing a relationship between a failure rate and an elasticity modulus E of sealing resin when semiconductor devices are divided into pieces in a third embodiment of the present invention.

FIG. 7 is a diagram showing a third embodiment of the present invention, and is a characteristic diagram showing a relationship between a failure rate (vertical axis) and an elasticity modulus E (horizontal axis) of sealing resin at the time of the division into pieces.

The third embodiment is the case where the sealing resin 6 with elasticity modulus E capable of achieving a failure rate of 0% as shown in FIG. 7 is used in order to stably divide semiconductor devices with high positional accuracy without exposing the surface mount components (the passive components 1, the semiconductor elements 3) even when dividing grooves are not provided using an expensive apparatus on a surface of the sealing resin 6 after the collective sealing, in the structure of the collectively-sealed semiconductor devices 100 or 101 of the first or the second embodiment. More specifically, this embodiment shows an example of a semiconductor device characterized in that the semiconductor devices are collectively sealed by a resin material whose elasticity modulus E of the sealing resin 6 when the semiconductor devices are divided into pieces is 0.5 GPa or more. It is desired that the material of the sealing resin 6 primarily contains epoxy resin.

For example, when the semiconductor devices are divided into pieces at the room temperature, an elasticity modulus of the sealing resin 6 at the room temperature has to be 0.5 GPa or more. Here, the failure rate shown in FIG. 7 means interfacial peeling between end face portions of the ceramic substrate 7 and the sealing resin 6, which is generated at the time of division. Further, any significant difference in variation of an extending direction of cracks is not seen when the elasticity modulus of the sealing resin 6 is 0.5 GPa or more, and it is confirmed that excellent dividing properties can be obtained.

As described above, according to this embodiment, also when such sealing resin 6 whose elasticity modulus is 0.5 GPa or more is used, similar to the first and second embodiments, the semiconductor devices can be stably divided with high positional accuracy, while suppressing the variations of an extending direction of cracks at the time of division. Therefore, costs of the semiconductor devices divided into pieces can be reduced.

Fourth Embodiment

Figure 8:
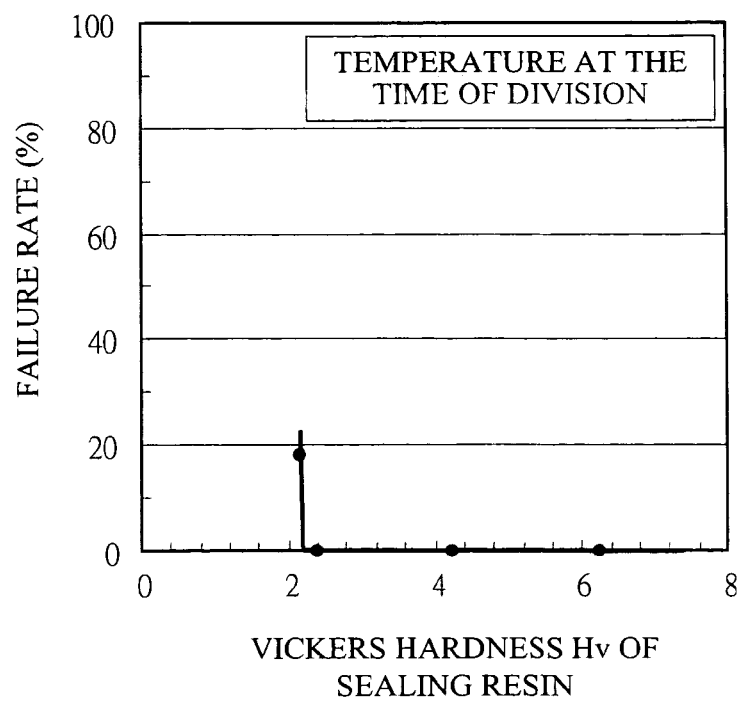
FIG. 8 is a characteristic diagram showing a relationship between a failure rate and Vickers hardness Hv of sealing resin when semiconductor devices are divided into pieces in a fourth embodiment of the present invention.

FIG. 8 is a diagram showing a fourth embodiment of the present invention, and is a characteristic diagram showing a relationship between a failure rate (vertical axis) and Vickers hardness Hv (horizontal axis) of sealing resin at the time of division into pieces.

The embodiment is the case where the sealing resin 6 with Vickers hardness Hv capable of achieving a failure rate of 0% as shown in FIG. 8 is used in order to stably divide semiconductor devices with high positional accuracy without exposing the surface mount components (the passive components 1, the semiconductor elements 3) even when dividing grooves are not provided using an expensive apparatus on a surface of the sealing resin 6 after the collective sealing, in the structure of the collectively-sealed semiconductor devices 100 or 101 of the first or the second embodiment. More specifically, this embodiment shows an example of a semiconductor device characterized in that the semiconductor devices are collectively sealed by a resin material whose Vickers hardness Hv of the sealing resin 6 when the semiconductor devices are divided into pieces is 2.3 or more. It is desired that the material of the sealing resin 6 primarily contains epoxy resin.

The measurement conditions of the Vickers hardness Hv conform to JIS Z2244 (ISO/DIS6057-1). More specifically, a test temperature is set to 23±5° C., a load speed of a test force with respect to an indentation depth of a Vickers indenter of 10 to 40 µm is set to 2 to 8 µm/s, a holding time of the test force is set to 10 s, and each number of measurements is set to 10 or more in consideration of measurement variation. According to the above description, for example, when the semiconductor devices are divided into pieces at the room temperature, a value of Vickers hardness Hv of the sealing resin 6 at the room temperature has to be 2.3 or more. Here, a failure rate shown in FIG. 8 means interfacial peeling between the end faces of the ceramic substrate 7 and the sealing resin 6, which is generated at the time of division. Further, any significant difference in variation of an extending direction of cracks is not seen when Vickers hardness Hv of the sealing resin 6 is 2.3 or more, and it is confirmed that excellent dividing properties can be obtained.

As described above, according to this embodiment, also when such sealing resin whose Vickers hardness Hv is 2.3 or more is used, similar to the first and second embodiments, the semiconductor devices can be stably divided with high positional accuracy, while suppressing the variations of an extending direction of cracks at the time of division. Therefore, costs of the semiconductor devices divided into pieces can be reduced.

Fifth Embodiment

Figure 9:
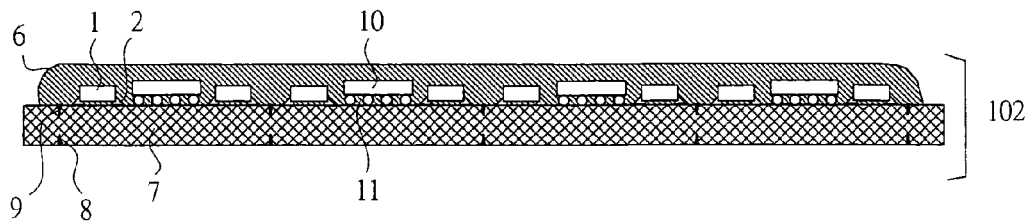
FIG. 9 is a sectional view showing semiconductor devices sealed collectively (corresponding to the first embodiment) in a fifth embodiment of the present invention.
Figure 10:
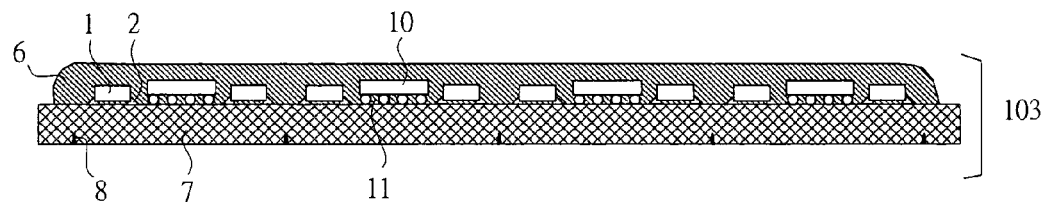
FIG. 10 is a sectional view showing semiconductor devices sealed collectively (corresponding to the second embodiment) in the fifth embodiment of the present invention.

FIG. 9 and FIG. 10 are diagrams showing a fifth embodiment of the present invention. FIG. 9 is a sectional view showing the semiconductor devices sealed collectively (corresponding to the first embodiment), and FIG. 10 is a sectional view showing the semiconductor devices sealed collectively (corresponding to the second embodiment).

This embodiment is different from the first and the second embodiments in type of a semiconductor element. As shown in FIG. 9 and FIG. 10, semiconductor devices 102 and 103 sealed collectively are each composed of the passive components 1, the connecting materials 2, the sealing resin 6, the ceramic substrate 7, the dividing grooves (8 and 9 in FIG. 9 and only 8 in FIG. 10), FCs (flip chips) or CSPs (chip size packages) 10, filling resin 11, and the like. Also, in a structure where the passive components 1 and the FCs or CSPs 10 are mounted on the ceramic substrate 7 and are collectively sealed by the sealing resin 6, the sealing resin 6 for collectively sealing the passive components 1 and FCs or CSPs 10 and the filling resin 11 of the FC or CSP 10 are made of the same resin. Note that it is also possible to apply the case where other filling resin 11 such as underfill which is different from the sealing resin 6 is used.

In the collectively-sealed semiconductor devices 102 and 103, FIG. 9 corresponds to the first embodiment and is an example of the structure where the dividing grooves 8 and 9 are provided on both the front and rear surfaces of the ceramic substrate 7 to be sealed by the sealing resin 6, and FIG. 10 corresponds to the second embodiment and is an example of the structure where the dividing groove 8 is provided only on the rear surface of the ceramic substrate 7.

Also in this embodiment, similar to the first and second embodiments and further the third and fourth embodiments, the collectively-sealed semiconductor devices 102 and 103 can be divided into pieces with high positional accuracy and semiconductor devices can be obtained stably.

As described above, according to this embodiment, even when the passive components 1 and the FCs or CSPs 10 are mounted on the ceramic substrate 7, similar to the first to fourth embodiments, the semiconductor devices can be divided with high positional accuracy, while suppressing the variations of an extending direction of cracks at the time of division. Therefore, a cost of a semiconductor device obtained by dividing the semiconductor devices into pieces can be reduced.

Sixth Embodiment

Figure 11:
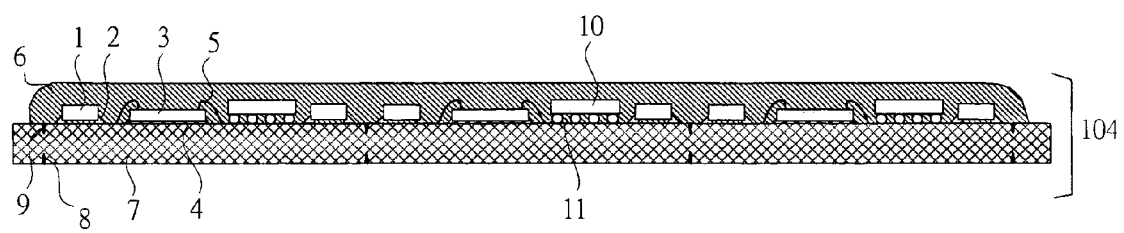
FIG. 11 is a sectional view showing semiconductor devices sealed collectively (corresponding to the first embodiment) in a sixth embodiment of the present invention.
Figure 12:
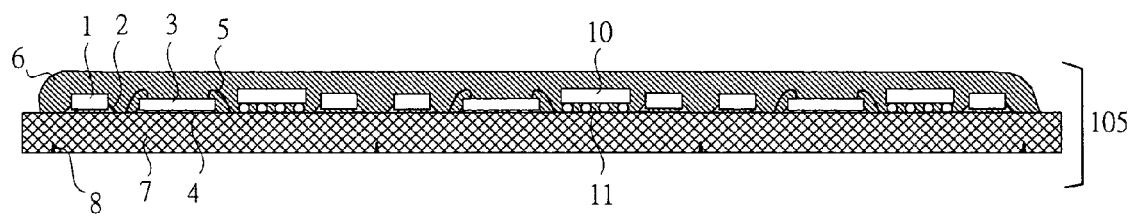
FIG. 12 is a sectional view showing semiconductor devices sealed collectively (corresponding to the second embodiment) in the sixth embodiment of the present invention.

FIG. 11 and FIG. 12 are diagrams showing a sixth embodiment of the present invention. FIG. 11 is a sectional view showing semiconductor devices sealed collectively (corresponding to the first embodiment), and FIG. 12 is a sectional view showing semiconductor devices sealed collectively (corresponding to the second embodiment).

This embodiment has a structure obtained by combining the first and the second embodiments and the fifth embodiment. As shown in FIG. 11 and FIG. 12, semiconductor devices 104 and 105 sealed collectively are each composed of the passive components 1, the connecting materials 2, the semiconductor elements 3, the connecting materials 4, the wires 5, the sealing resin 6, the ceramic substrate 7, the dividing grooves (8 and 9 in FIG. 11, and only 8 in FIG. 12), the FCs or CSPs 10, the filling resin 11, and the like. Also, in a structure where the passive components 1, the semiconductor elements 3, and the FCs or CSPs 10 are mounted on the ceramic substrate 7 and are collectively sealed by the sealing resin 6, the sealing resin 6 for collectively sealing the passive components 1 and the semiconductor elements 3 and the filling resin 11 of the FC or CSP 10 are made of the same resin. Note that it is also possible to apply the case where other filling resin 11 such as underfill which is different from the sealing resin 6 is used.

In the collectively-sealed semiconductor devices 104 and 105, FIG. 11 corresponds to the first embodiment and is an example of the structure where the dividing grooves 8 and 9 are provided on both the front and rear surfaces of the ceramic substrate 7 to be sealed by the sealing resin 6, and FIG. 12 corresponds to the second embodiment and is an example of the structure where the dividing groove 8 is provided only on the rear surface of the ceramic substrate 7.

Also in this embodiment, similar to the first and second embodiments and further the third and fourth embodiments, the collectively-sealed semiconductor devices 104 and 105 can be divided into pieces with high positional accuracy and semiconductor devices can be obtained stably.

As described above, according to this embodiment, even when the passive components 1, the semiconductor elements 3, and the FCs or CSPs 10 are mounted on the ceramic substrate 7, similar to the first to fifth embodiments, the semiconductor devices can be divided with high positional accuracy, while suppressing the variations of an extending direction of cracks at the time of division. Therefore, a cost of a semiconductor device obtained by dividing the semiconductor devices into pieces can be reduced.

Seventh Embodiment

FIG. 13 is a diagram showing a seventh embodiment of the present invention, and includes sectional views showing a process from the manufacture of collectively-sealed semiconductor devices to the manufacture of each piece of a semiconductor device.

This embodiment corresponds to the first embodiment, and each of the steps from mounting various types of surface mount components on the ceramic substrate 7 to dividing the semiconductor devices into individual semiconductor devices 110 will be described. Note that, even in the cases corresponding to the second to sixth embodiments, the semiconductor device can be manufactured in the same manner.

First, the passive components 1 and the semiconductor elements 3 are mounted on the ceramic substrate 7 in which the dividing grooves 8 and 9 are formed in advance. At this time, after a connecting material 2 such as solder is supplied by a screen printing method or an applying method onto the ceramic substrate 7, the passive components 1 are mounted and then the solder is heated and melted at a predetermined temperature, thereby connecting the passive components 1.

On the other hand, after the connecting material 4 for mechanically fixing the semiconductor elements 3 is supplied onto the ceramic substrate 7 by the screen printing method or the applying method, the semiconductor elements 3 are mounted and then the connecting material 4 is heated, thereby fixing the semiconductor elements 3. Further, electrical connection of the semiconductor elements 3 is made between the electrode on the ceramic substrate 7 and the electrode of the semiconductor elements 3 using wires 5 such as Au.

Here, if the surface of the semiconductor element 3 or the ceramic substrate 7 is contaminated by organic matter, it is desired that they are connected after performing the wet cleaning by alcohol, acetone or the like or the dry cleaning.

Next, in order to protect the passive components 1, the semiconductor elements 3 and electric wires which are mounted on the ceramic substrate 7, they are collectively sealed by the sealing resin 6. In the collective sealing by the sealing resin 6, the sealing resin 6 is first supplied by a printing or applying method, and the sealing resin 6 is heated to a predetermined temperature and then cured.

Here, a method of reducing the viscosity of the resin using a method such as heating or a method of deforming by placing the semiconductor device in a vacuum environment is desirably performed before the sealing resin 6 is cured in order to reduce the voids. Besides, it is desired that two-step curing process including a low temperature step and a high temperature step is used to cure the sealing resin 6 in order to reduce a stress generated at the curing time of the sealing resin 6 as much as possible.

Finally, tensile stress is applied to the semiconductor devices 100 sealed collectively by the sealing resin 6 in such a direction that the dividing grooves 8 of the rear surface of the ceramic substrate 7 of the semiconductor devices 100 become principal stress surfaces. For example, a method of applying tensile stress in a direction indicated by an arrow is desired. By this means, it becomes possible to divide the semiconductor devices 100 into pieces of the semiconductor device 100 with high positional accuracy by a simple method.

As described above, according to this embodiment, in the process from the manufacture of semiconductor devices sealed collectively to the manufacture of each piece of a semiconductor device, similar to the first to sixth embodiments, the semiconductor devices can be divided with high positional accuracy, while suppressing the variations of an extending direction of cracks at the time of division. Therefore, a cost of a semiconductor device obtained by dividing the semiconductor devices into pieces can be reduced.

Eighth Embodiment

FIG. 14 is a diagram showing an eighth embodiment of the present invention, and is a schematic diagram showing a state where a semiconductor device obtained by the division into pieces is mounted on a mobile device.

This embodiment is an application example when the semiconductor device 110 obtained by the division into pieces according to the first to seventh embodiments is mounted on a mobile device 120 such as a cellular phone.

In this manner, the semiconductor device 110 obtained by the division into pieces according to the first to seventh embodiments can be applied to a mobile device 120 such as a cellular phone.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, a semiconductor element of the surface mount component can be widely applied to various mounting structures such as the face-up mounting, the flip chip mounting and the ball grid array mounting as well as the mounting structure of the above-described embodiments.

The present invention can be utilized in the semiconductor devices obtained through the process where a plurality of surface mount components are collectively sealed by resin and the collectively-sealed semiconductor devices are divided into individual modules and in a mobile device in which the semiconductor device is incorporated. In particular, the module in which the passive components and the semiconductor elements are mounted on the ceramic substrate and then sealed by resin is an important component for realizing the downsizing, weight reduction and height reduction of a mobile device. Further, a technology for making it possible to divide a substrate collectively sealed by the sealing resin into individual modules through a simple method is an important technology for realizing the cost reduction.

What is claimed is:

1. A semiconductor device comprising:
a ceramic substrate;
a surface mount component mounted on said ceramic substrate; and
sealing resin for sealing said surface mount component mounted on said ceramic substrate, said sealing resin having a thickness equal to or less than a thickness of said ceramic substrate,
wherein, in a manufacturing process thereof, said ceramic substrate is composed of a multiple piece substrate in which dividing grooves for division into respective pieces are formed on both front and rear surfaces in advance, a plurality of said surface mount components are mounted on said multiple piece substrate and sealed collectively by said sealing resin, and then said ceramic substrate and said sealing resin, which does not contain any dividing groove, are divided along said dividing grooves of said ceramic substrate by applying tensile stress in such a direction that the dividing grooves of the rear surface of the ceramic substrate become principal stress surfaces, thereby manufacturing respective pieces having dimensions defined by said ceramic substrate, in this division, cracks are extended from the dividing grooves of the rear surface of the ceramic substrate, in the thickness direction of the ceramic substrate, penetrating the sealing resin, which does not contain any dividing groove, thereby dividing the sealing resin, and when the shortest distance from an end on the front surface of said ceramic substrate to an end of said surface mount component is set to "a" μm, a thickness of said ceramic substrate is set to "b" μm, and sum of depths of the dividing grooves on the front and rear surfaces of said ceramic substrate is set to "c" μm, a relationship of a≧269×c/b+151 is established.

2. The semiconductor device according to claim 1, wherein a relationship of 0<c/b<2/3 is also established.

3. The semiconductor device according to claim 1, wherein an elasticity modulus of said sealing resin is 0.5 GPa or more at the time of division into respective pieces.

4. The semiconductor device according to claim 1, wherein Vickers hardness Hv of said sealing resin is 2.3 or more at the time of division into respective pieces.

5. The semiconductor device according to claim 1, wherein a material of said sealing resin primarily contains epoxy resin.

6. The semiconductor device according to claim 1, wherein said surface mount component comprises at least one of a capacitor, a resistor, a filter, an inductor, a semiconductor element with a face-up mounting structure, a semiconductor element with a flip chip mounting structure, and a semiconductor element with a ball grid array mounting structure including a chip size package.

* * * * *